(12) United States Patent
Toncich et al.

(10) Patent No.: US 7,174,147 B2
(45) Date of Patent: Feb. 6, 2007

(54) BANDPASS FILTER WITH TUNABLE RESONATOR

(75) Inventors: Stanley S. Toncich, San Diego, CA (US); Jorge Fabrega-Sanchez, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 0 days.

(21) Appl. No.: 11/060,036

(22) Filed: Feb. 16, 2005

(65) Prior Publication Data

US 2005/0148312 A1    Jul. 7, 2005

Related U.S. Application Data

(63) Continuation-in-part of application No. 10/981,814, filed on Nov. 5, 2004, which is a continuation of application No. 10/076,171, filed on Feb. 12, 2002, now Pat. No. 6,816,714.

(60) Provisional application No. 60/283,093, filed on Apr. 11, 2001.

(51) Int. Cl.
*H04B 1/16* (2006.01)

(52) U.S. Cl. .................. 455/339; 455/125; 455/178.1; 333/171; 330/303

(58) Field of Classification Search ................ 455/286, 455/339, 120, 121, 124, 125, 150.1, 170.1, 455/178.1, 334, 338; 333/171, 174, 175, 333/176, 173, 168, 170, 17.1; 330/302, 303
See application file for complete search history.

(56) References Cited

U.S. PATENT DOCUMENTS

| | | | |
|---|---|---|---|
| 3,239,838 A | 3/1966 | Kelleher | |
| 3,413,543 A | 11/1968 | Schubring et al. | |
| 3,569,795 A | 3/1971 | Gikow | |
| 3,676,803 A | 7/1972 | Simmons | |

(Continued)

FOREIGN PATENT DOCUMENTS

DE    40 36 866    7/1991

(Continued)

OTHER PUBLICATIONS

Chandler, S.R. et al., "Active Varactor Tunable Bandpass Filter," IEEE Microwave and Guided Wave Letters, vol. 3, No. 3, Mar. 1993, pp. 70-71.

(Continued)

*Primary Examiner*—Edward F. Urban
*Assistant Examiner*—Nhan T. Le (57) ABSTRACT

A tunable bandpass filter is provided that comprises a first shunt-connected ferroelectric (FE) tunable tank circuit having a first node to accept an input signal. A second shunt-connected FE tunable tank circuit has a second node to supply a bandpass filtered signal. A first capacitor is connected in series between the first and second nodes. In one aspect, the first tank circuit comprises a first resonator connected to the first node, and a fourth capacitor connected between the first resonator and a reference voltage. The fourth capacitor is a tunable FE capacitor. Typically, a fifth capacitor is connected between the first node and the reference voltage. Likewise, the second tank circuit comprises a second resonator connected to the second node, and a sixth (FE) capacitor connected between the second resonator and the reference voltage. A seventh capacitor is connected between the second node and the reference voltage.

18 Claims, 6 Drawing Sheets

U.S. PATENT DOCUMENTS

| | | |
|---|---|---|
| 3,678,305 A | 7/1972 | George |
| 3,680,135 A | 7/1972 | Boyer |
| 3,737,814 A * | 6/1973 | Pond .......................... 333/189 |
| 3,739,299 A | 6/1973 | Adler |
| 3,836,874 A | 9/1974 | Maeda et al. |
| 3,918,012 A | 11/1975 | Peuzin |
| 4,122,400 A | 10/1978 | Medendorp et al. |
| 4,236,125 A | 11/1980 | Bernard et al. |
| 4,475,108 A | 10/1984 | Moser |
| 4,484,157 A | 11/1984 | Helle et al. |
| 4,494,081 A | 1/1985 | Lea et al. |
| 4,525,720 A | 6/1985 | Corzine et al. |
| 4,626,800 A | 12/1986 | Murakami et al. |
| 4,733,328 A | 3/1988 | Blazej |
| 4,736,169 A | 4/1988 | Weaver et al. |
| 4,737,797 A | 4/1988 | Siwiak et al. |
| 4,746,925 A | 5/1988 | Toriyama |
| 4,792,939 A | 12/1988 | Hikita et al. |
| 4,799,066 A | 1/1989 | Deacon |
| 4,835,499 A | 5/1989 | Pickett |
| 4,835,540 A | 5/1989 | Haruyama et al. |
| 4,847,626 A | 7/1989 | Kahler et al. |
| 4,975,604 A | 12/1990 | Barta |
| 5,166,857 A | 11/1992 | Avanic et al. |
| 5,173,709 A | 12/1992 | Lauro et al. |
| 5,212,463 A | 5/1993 | Babbitt et al. |
| 5,216,392 A | 6/1993 | Fraser |
| 5,227,748 A | 7/1993 | Sroka |
| 5,231,407 A | 7/1993 | McGirr et al. |
| 5,293,408 A | 3/1994 | Takahashi et al. |
| 5,307,033 A | 4/1994 | Koscica et al. |
| 5,325,099 A | 6/1994 | Nemit et al. |
| 5,388,021 A * | 2/1995 | Stahl .......................... 361/56 |
| 5,406,163 A | 4/1995 | Carson et al. |
| 5,416,803 A | 5/1995 | Janer |
| 5,427,988 A | 6/1995 | Sengupta et al. |
| 5,450,092 A | 9/1995 | Das |
| 5,451,915 A | 9/1995 | Katzin et al. |
| 5,459,123 A | 10/1995 | Das |
| 5,472,935 A | 12/1995 | Yandrofski et al. |
| 5,479,139 A | 12/1995 | Koscica et al. |
| 5,495,215 A | 2/1996 | Newell et al. |
| 5,496,795 A | 3/1996 | Das |
| 5,496,796 A | 3/1996 | Das |
| 5,502,422 A | 3/1996 | Newell et al. |
| 5,525,942 A | 6/1996 | Horii et al. |
| 5,557,286 A | 9/1996 | Varadan et al. |
| 5,561,307 A | 10/1996 | Mihara et al. |
| 5,561,407 A | 10/1996 | Koscica et al. |
| 5,564,086 A | 10/1996 | Cygan et al. |
| 5,574,410 A * | 11/1996 | Collins et al. .............. 333/17.3 |
| 5,577,025 A | 11/1996 | Skinner |
| 5,583,524 A | 12/1996 | Milroy |
| 5,589,845 A | 12/1996 | Yandrofski et al. |
| 5,600,279 A | 2/1997 | Mori |
| 5,617,104 A | 4/1997 | Das |
| 5,640,042 A | 6/1997 | Koscica et al. |
| 5,649,306 A | 7/1997 | Vanatta et al. |
| 5,652,599 A | 7/1997 | Wallace et al. |
| 5,673,188 A * | 9/1997 | Lusher et al. ................ 363/132 |
| 5,701,595 A | 12/1997 | Green, Jr. |
| 5,721,194 A | 2/1998 | Yandrofski et al. |
| 5,729,239 A | 3/1998 | Rao |
| 5,777,524 A | 7/1998 | Wojewoda et al. |
| 5,777,839 A | 7/1998 | Sameshina et al. |
| 5,778,308 A | 7/1998 | Sroka et al. |
| 5,830,591 A | 11/1998 | Sengupta et al. |
| 5,834,975 A | 11/1998 | Bartlett et al. |
| 5,864,932 A | 2/1999 | Evans et al. |
| 5,870,670 A | 2/1999 | Ripley |
| 5,880,921 A | 3/1999 | Tham et al. |
| 5,892,486 A | 4/1999 | Cook et al. |
| 5,908,811 A | 6/1999 | Das |
| 5,910,994 A | 6/1999 | Lane et al. |
| 5,945,887 A | 8/1999 | Makino et al. |
| 5,965,494 A | 10/1999 | Terashima et al. |
| 5,973,567 A | 10/1999 | Heal et al. |
| 5,973,568 A | 10/1999 | Shapiro et al. |
| 5,986,515 A | 11/1999 | Sakurai |
| 5,987,314 A | 11/1999 | Salto |
| 5,990,766 A | 11/1999 | Zhan |
| 6,008,659 A | 12/1999 | Traynor |
| 6,018,282 A | 1/2000 | Tsuda |
| 6,020,787 A | 2/2000 | Kim et al. |
| 6,026,311 A | 2/2000 | Willemsen Cortes et al. |
| 6,028,561 A | 2/2000 | Takei |
| 6,049,726 A | 4/2000 | Gruenwald et al. |
| 6,052,036 A | 4/2000 | Enstrom et al. |
| 6,054,908 A | 4/2000 | Jackson |
| 6,094,588 A | 7/2000 | Adam |
| 6,097,263 A | 8/2000 | Mueller et al. |
| 6,101,102 A | 8/2000 | Brand et al. |
| 6,108,191 A | 8/2000 | Bruchhaus et al. |
| 6,160,524 A | 12/2000 | Wilber |
| 6,181,777 B1 * | 1/2001 | Kiko ....................... 379/32.04 |
| 6,198,441 B1 | 3/2001 | Okabe |
| 6,216,020 B1 | 4/2001 | Findikoglu |
| 6,242,843 B1 | 6/2001 | Pohjonen et al. |
| 6,272,336 B1 | 8/2001 | Appel et al. |
| 6,278,383 B1 | 8/2001 | Endo et al. |
| 6,281,023 B2 | 8/2001 | Eastep et al. |
| 6,281,534 B1 | 8/2001 | Arita et al. |
| 6,285,337 B1 | 9/2001 | West et al. |
| 6,292,143 B1 | 9/2001 | Romanofsky |
| 6,294,964 B1 | 9/2001 | Satoh |
| 6,308,051 B1 * | 10/2001 | Atokawa ...................... 455/78 |
| 6,327,463 B1 * | 12/2001 | Welland ...................... 455/260 |
| 6,329,959 B1 | 12/2001 | Varadan et al. |
| 6,333,719 B1 | 12/2001 | Varadan |
| 6,335,710 B1 | 1/2002 | Falk et al. |
| 6,344,823 B1 | 2/2002 | Deng |
| 6,359,444 B1 | 3/2002 | Grimes |
| 6,362,784 B1 | 3/2002 | Kane et al. |
| 6,362,789 B1 | 3/2002 | Trumbull et al. |
| 6,366,489 B1 * | 4/2002 | Salling ........................ 365/145 |
| 6,384,785 B1 | 5/2002 | Kamogawa et al. |
| 6,404,304 B1 | 6/2002 | Kwon et al. |
| 6,456,236 B1 | 9/2002 | Hauck et al. |
| 6,462,628 B2 | 10/2002 | Kondo et al. |
| 6,489,860 B1 | 12/2002 | Ohashi |
| 6,503,786 B2 | 1/2003 | Klodzinski |
| 6,518,850 B1 | 2/2003 | Falk et al. |
| 6,518,920 B2 | 2/2003 | Proctor, Jr. et al. |
| 6,522,220 B2 | 2/2003 | Yamada et al. |
| 6,525,630 B1 | 2/2003 | Zhu et al. |
| 6,525,691 B2 | 2/2003 | Varadan et al. |
| 6,531,936 B1 | 3/2003 | Chiu et al. |
| 6,559,737 B1 | 5/2003 | Nagra et al. |
| 6,571,110 B1 | 5/2003 | Patton et al. |
| 6,600,456 B2 | 7/2003 | Gothard et al. |
| 6,653,977 B1 | 11/2003 | Okabe et al. |
| 6,667,723 B2 | 12/2003 | Forrester |
| 6,686,817 B2 | 2/2004 | Zhu et al. |
| 6,721,293 B1 | 4/2004 | Komulainen et al. |
| 6,727,535 B1 | 4/2004 | Sengupta et al. |
| 6,819,203 B2 | 11/2004 | Taniguchi |
| 6,842,086 B1 | 1/2005 | Zennamo, Jr. |
| 2001/0026243 A1 | 10/2001 | Koitsalu et al. |
| 2001/0043159 A1 | 11/2001 | Masuda et al. |
| 2002/0049064 A1 | 4/2002 | Banno |
| 2002/0093400 A1 | 7/2002 | Zhu et al. |
| 2002/0149526 A1 * | 10/2002 | Tran et al. .................. 343/702 |
| 2002/0149535 A1 | 10/2002 | Toncich |
| 2002/0175878 A1 | 11/2002 | Toncich |

| | | | |
|---|---|---|---|
| 2003/0062971 A1 | 4/2003 | Toncich | |
| 2003/0134665 A1 | 7/2003 | Kato et al. | |
| 2004/0087280 A1 | 5/2004 | Watanabe et al. | |
| 2004/0162047 A1 | 8/2004 | Kasahara et al. | |
| 2004/0196121 A1 | 10/2004 | Toncich | |
| 2004/0212457 A1 | 10/2004 | Eden et al. | |
| 2004/0263411 A1 | 12/2004 | Fabrega-Sanchez et al. | |
| 2005/0007291 A1 | 1/2005 | Fabrega-Sanchez et al. | |

FOREIGN PATENT DOCUMENTS

| | | |
|---|---|---|
| DE | 100 24 483 | 11/2001 |
| DE | 101 37 753 | 2/2003 |
| EP | 0 125 586 | 11/1984 |
| EP | 0 346 089 | 12/1989 |
| EP | 0 473 373 | 3/1992 |
| EP | 0 531 125 | 3/1993 |
| EP | 0 631 399 | 12/1994 |
| EP | 0 637 131 | 2/1995 |
| EP | 0 680 108 | 11/1995 |
| EP | 0 795 922 | 9/1997 |
| EP | 0 854 567 | 7/1998 |
| EP | 0 872 953 | 10/1998 |
| EP | 0 881 700 | 12/1998 |
| EP | 0 892 459 | 1/1999 |
| EP | 0 909 024 | 4/1999 |
| EP | 1 043 741 | 10/2000 |
| EP | 1 058 333 | 12/2000 |
| EP | 1 248 317 | 10/2002 |
| GB | 2 240 227 | 7/1991 |
| JP | 63 128618 | 6/1988 |
| JP | 05182857 | 7/1993 |
| JP | 2001 338839 | 12/2001 |
| WO | WO 82/03510 | 10/1982 |
| WO | WO 94/27376 | 11/1994 |
| WO | WO 00/35042 | 6/2000 |
| WO | WO 00/62367 | 10/2000 |
| WO | WO 03/058759 | 7/2001 |
| WO | WO 02/084798 | 10/2002 |

OTHER PUBLICATIONS

Chang, C. et al., "Microwave Active Filters Based on Coupled Negative Resistance Method," IEEE Trans. on Microwave Theory & Techs., vol. 38, No. 12, Dec. 1990, pp. 1879-1884.

Cohn, S.B., "Dissipation Loss in Multiple-Coupled-Resonator Filters," Proc. IRE 47, Aug. 1959, pp. 1342-1348.

Cuthbert, T., "Broadband Impedance Matching -Fast and Simple", RF Design, Cardiff Publishing Co., vol. 17, No. 12, Nov. 1994, pp. 38, 42, 44, 48, XP000477834.

Dishal, M., "Alignment and Adjustment of Synchronously Tuned Multiple Resonator-Circuit Filters," Proc. IRE 39, Nov. 1951, pp. 1448-1455.

Erker et al., "Monolithic Ka-Band Phase Shifter Using Voltage Tunable BaSrTiO3 Parallel Plate Capacitors", IEEE Microwave and Guided Wave Letters, IEEE Inc., vol. 10, No. 1, Jan. 2000, pp. 10-12 XP-000930368.

Fubini, E.G. et al., "Minimum Insertion Loss Filters," Proc. IRE 47, Jan. 1959, pp. 37-41.

Fujita, K. et al., "A 15.6 GHz Commercially Based 1/8 GaAs Dynnamic Presealer," 1989 IEEE GaAs IC Symposium, pp. 113-116.

Galt, D. et al., "Ferroelectric Thin Film Characterization Using Superconducting Microstrip Resonators", IEEE Trans on Appl Superconductivity Jun. 1995 IEEE, pp. 2575-2578, vol. 5, No. 2, Piscataway, NJ, USA.

Getsinger, W.J., "Prototypes for Use in Broadbanding Reflection Amplifiers," IEEE Trans. PTGMTT-11, Nov. 1963, pp. 486-497.

Getsinger, W.J. et al., "Some Aspects of the Design of Wide-Band Up-Converters and Nondegenerate Parametric Amplifiers," IEEE Trans. PTGMTT-12, Jan. 1964, pp. 77-87.

Gevorgian, Spartak S. et al., "HTS/Ferroelectric Devices for Microwave Applications", IEEE Transactions on Applied Superconductivity, Jun. 1997, pp. 2458-2461, IEEE, USA.

Hopf, B. et al., "Coplanar MMIC Active Bandpass Filters Using Negative Resistance Circuits," 1994 IEEE MTT-S Symposium Digest, pp. 1183-1185.

Hunter, I.C. et al., "Electronically Tunable Microwave Bandpass Filters," IEEE Trans. on MTT, vol. 30, No. 9, Sep. 1982, pp. 1354-1367.

Jose et al., "Experimental investigations on electronically tunable microstrip antennas," Feb. 05, 1999, Microwave and optical technology letters, vol. 20, No. 3, pp. 166-169.

Kapilevich, B., "Understand the Operation of Channelized Active Filters," Microwaves & RF, Jan. 1997, pp. 89-92.

Kapilevich, B., "Variety of Approaches to Designing Microwave Active Filters," Proc. 27th European Microwave Conference, Jerusalem, vol. 1, 1997, pp. 397-408.

Karacaoglu, U. et al., "High Selectivity Varactor-Tuned MMIC Bandpass Filter Using Lossless Active Resonators," 1994 IEEE MTT-Symposium Digest, pp. 1191-1194.

Katzin, P. et al., "Narrow-band MMIC Filters with Automatic Tuning and Q-Factor Control," 1993 IEEE MTT-S Int. Microwave Symposium Digest, pp. 403-406.

Keis, V. N. et al., "20GHz tunable filter based on ferroelectric (BaSr) TiO3 film varactors", Electronics Letters, May 28, 1998, vol. 34, No. 11, IEE Stevenage, GB.

Kotzebue, K.L., "Broadband Electronically-Tunable Microwave Filters," 1960 IRE Wescon Convention Record, Part 1, pp. 21-27.

Kozyrev, A., et al., "Ferroelectric Films: Nonlinear Properties and Applications in Microwave Devices", 1998 IEEE MTT-S Digest, May 1998, pp. 985-988, 1998 IEEE MTT-S Intl Baltimore, MD, USA, IEEE, USA.

Krautkramer, V.W. et al., "Resonanztransformatoren mit drei Reaktanzen als transformierende Filter", Bulletin des Schweizerischen Elektrotechnischen Vereins, Zurich, CH, vol. 64, No. 23, Nov. 10, 1973, pp. 1500-1509, XP002184530.

Kuh, E.S. et al., "Optimum Synthesis of Wide-Band Parametric Amplifiers and Converters," IRE Trans. PCCT-8, Dec. 1961, pp. 410-415.

Louhos, J.P. et al., "Electrical Tuning of Integrated Mobile Phone Antennas," Nokia Mobile Phones, pp. 69-97 (Sep. 15, 1999).

Makioka, S. et al., "A High Efficiency GaAs MCM Power Amplifier for 1.9 GHz Digital Cordless Telephones," IEEE 1994 Microwave & Millimeter-Wave Monolithic Cir. Sym., pp. 51-54.

Matthaei, G.L., "An Electronically Tunable Up-Converter," Proc. IRE 49, Nov. 1961, pp. 1703-1704.

Nauta, B., "A CMOS Transconductance-C Filter Technique for Very High Frequencies," IEEE Journal of Solid-State Circuits, vol. 27, No. 2, Feb. 1992, pp. 142-153.

Panayi, P.K. et al., "Tuning Techniques for the Planar Inverted-F Antenna," National Conference on Antennas and Propagation Publication, No. 461, pp. 259-262, (Apr. 1999).

Presser, A., "Varactor-Tunable, High-Q Microwave Filter," RCA Review, vol. 42, Dec. 1981, pp. 691-705.

Sleven R.L., "Design of a Tunable Multi-Cavity Waveguide Band-Pass Filter," 1959 IRE National Convention Record, Part 3, pp. 91-112.

Smuk, J. et al., "MMIC Phase Locked L-S Band Oscillators," 1994 IEEE GaAs Symposium Digest, pp. 27-29.

Taub, J.J. et al., "Design of Three-Resonator Dissipative Band-Pass Filters Having Minimum Insertion Loss," Proc. IRE 45, pp. 681-687 (May 1957).

Toncich et al., "Data Reduction Method for Q Measurements of Stripline Resonators", IEEE Transactions in MTT, vol. 40, No. 9, Sep. 1992, pp. 1833-1836.

Toyoda, S., "Quarter-wavelength Coupled Variable Bandstop and Bandpass Filters Using Varactor Diodes," IEEE Trans. on MTT, vol. 30, No. 9, Sep. 1982, pp. 1387-1389.

Varadan, V.K. et al., "Design and Development of Electronically Tunable Microstrip Antennas," IOP Publishing Ltd., pp. 238-242, (1999).

Vendik, O.G. et al., "1GHz tunable resonator on bulk single crystal SrTiO3 plated with Yba2Cu307-x films", Electronics Letters, Apr. 13, 1995, pp. 654-656, vol. 31, No. 8, IEE Stevenage, GB.

* cited by examiner

BANDPASS FILTER WITH TUNABLE RESONATOR

RELATED APPLICATIONS

This application is a continuation-in-part of U.S. application Ser. No. 10/981,814, filed Nov. 5, 2004, which is a continuation of U.S. application Ser. No. 10/076,171, filed Feb. 12, 2002, now U.S. Pat. No. 6,816,714, which claims the benefit of U.S. Provisional Application Ser. No. 60/283,093, filed Apr. 11, 2001, the disclosures of which are hereby incorporated by reference. In addition, this application relates to U.S. application Ser. No. 09/904,631 filed on Jul. 13, 2001, now U.S. Pat. No. 6,690,176, U.S. application Ser. No. 09/912,753 filed on Jul. 24, 2001, now U.S. Pat. No. 6,639,491, U.S. application Ser. No. 09/927,732 filed on Aug. 8, 2001, U.S. application Ser. No. 09/927,136, filed on Aug. 10, 2001, now U.S. Pat. No. 6,825,818, U.S. application Ser. No. 10/044,522, filed on Jan. 11, 2002, now U.S. Pat. No. 6,737,930, and U.S. application Ser. No. 10/077,654, filed on Feb. 14, 2002, the disclosures of which are hereby incorporated by reference.

FIELD OF THE INVENTION

This invention generally relates to radio frequency (RF) electronics and, more particularly, to a wireless communications bandpass filter with a tunable resonator section.

BACKGROUND OF THE INVENTION

Filters, such as bandpass filters, have numerous applications in communications and electronics. In wireless multiple access communications, a given frequency band must accommodate many wireless users. To accommodate so many users, stringent bandpass filtering requirements are required to minimize interference from communications occurring in neighboring frequency bands or channels.

Conventionally, wireless handsets use fixed-tuned bandpass filters (BPFs) to meet their filtering specifications. The design of such filters is complicated because they must achieve the lowest possible passband insertion loss (IL), while simultaneously achieving a specified large out-of-band rejection. As a specific example, consider full band PCS CDMA handsets using fixed bandwidth filters. The PCS transmit (Tx) band should have no more than −3.5 dB IL inband (1850 to 1910 MHz in the US), while having at least a 38.0 dB out-of-band rejection in the receive (Rx) band (1930 to 1990 MHz range).

Further, this BPF is constrained by size limitations, as manufacturers are continually attempting to manufacture smaller wireless devices. A typical height constraint for a conventional handsets may be 4.0 mm, or less. To meet these demanding electrical requirements, yet possess the smallest possible size and height, high order fixed-tuned filters constructed from either individual coaxial resonator elements or monoblock structures are usually necessary. In addition, to satisfy out-of-band rejection requirements, a transmission zero is usually required, increasing IL at the band edge. Because of variations in ceramics and fabrication tolerances, vendors must individually adjust the characteristics of fixed-tuned filters during their manufacture, driving costs higher.

Moreover, if more than one frequency band is to be supported (e.g., supporting the PCS bands in the U.S., Korea, and India) multiple fixed-tuned BPFs are necessary, requiring extra switches that introduce additional losses. This is true, even if the power amplifier and low noise amplifier used have sufficient bandwidth to operate over these multiple bands.

A tunable BPF permits the BPF to be used over several bands. That is, a lower order filter with a narrow bandpass can be used to selectively tune within a larger passband. To provide tunability in a tunable BPF, a component capable of providing a variable capacitance is typically used.

Several structures are presently used to implement a variable capacitor. For example, movable parallel plates have been used for many years as the tuner in home radios. However, such plates are far too bulky, noisy, and impractical for use in most modern applications. Another alternative, the electronic varactor, is a semiconductor device that adjusts capacitance responsive to an applied voltage. Because the varactor is typically noisy and lossy, particularly in applications above 500 MHz, it is ineffective for high-frequency, low-loss applications where high performance is required.

Another alternative, a microelectromechanical system (MEMS) device can be used to switch between capacitors, responsive to an applied control signal. These devices have not yet proven practical for high-volume low-cost manufacturing. Further, such a mechanism still only provides discrete tuning, between a finite number of fixed capacitor values.

Ferroelectric tunable capacitors are another alternative. Ferroelectric (FE) materials are a class of materials, typically ceramic rare-earth oxides, whose prominent feature is that their dielectric constant (K), and as a consequence, the electric permittivity ($\epsilon$) changes in response to an applied slowly varying (DC or low frequency) electric field. The relationship of the dielectric constant and the electric permittivity of a material is given as follows:

$$\epsilon = K\epsilon_O$$

where $\epsilon_O$ is the electric permittivity of a vacuum. At present, there are several hundred known materials that possess FE properties. In a typical FE material, one can obtain a change in dielectric constant as great as approximately 3:1. The DC voltage required to generate such changes depends, in one aspect, upon the dimensions of the FE material over which a DC control voltage is applied. As a result of their variable dielectric constant, one can make tunable capacitors using FE materials, because the capacitance of a capacitor depends on the dielectric constant of the dielectric proximate the capacitor conductors. Typically, a tunable FE capacitor is realized as a parallel plate (overlay), interdigital (IDC), or a gap capacitor.

Conventional FE variable capacitors use a layer of an appropriate FE material, such as barium strontium titanate, $Ba_xSr_{1-x}TiO_3$ (BSTO), disposed adjacent to one or both conductors of a capacitor. Depending upon the strength of the electric field applied to the FE material and the intrinsic properties of the FE material selected, the capacitance changes. Typically, below the Curie temperature ($T_C$) of the FE film, the FE material is in the ferroelectric state and will exhibit hysteresis in its response to a changing electric field. Above $T_C$, the FE material is in the paraelectric state and will not exhibit hysteresis. Thus, an FE material is generally chosen that has a $T_C$ lower than the expected operating temperature so as to operate in the paraelectric state, avoiding the hysteresis effects of the ferroelectric state.

However, conventional FE variable capacitors have proven to be too lossy for use in insertion-loss-sensitive applications such as in the RF circuits of handsets. Moreover, these devices often perform unpredictably, preventing optimal design, construction, and use of FE tunable filters.

Duplexers are used in wireless telephone technology to separate the Tx and the Rx frequencies into their respective signal paths. Duplexers typically comprise two bandpass filters. Each filter "selects" either the Tx or the Rx frequency signal to be passed. The filters are coupled together at one end, forming a common port. This common port is typically coupled to an antenna or a diplexer for sending transmit signals and receiving receive signals.

Strict insertion loss and out-of-band rejection requirements are the primary requirements that influence the design of duplexers for use in loss-sensitive applications, for example, in wireless handsets. Other electrical and mechanical specifications must also be satisfied, such as, for example, size and height requirements.

It would be advantageous if a bandpass filter could be made tunable, to operate at a number of channels within a frequency band.

It would be advantageous if the tunable bandpass filter could be tuned to operate in multiple frequency bands.

It would be advantageous if the above-mentioned bandpass filter could be fabricated using an FE tunable capacitor.

It would be advantageous if a duplexer could be made using two tunable bandpass filters.

SUMMARY OF THE INVENTION

In wireless handsets, strict insertion loss and out-of-band rejection requirements generally mandate high order (multiple pole) filters for use in duplexers. The inband insertion loss requirements generally apply to a frequency band that is wider than any particular channel in the frequency band that may be used. This means that a fixed tuned filter must have a broader passband than would a tunable filter operating in the same passband. Because the tunable filter can have a smaller (tunable) passband, it can have a lower order (fewer poles), taking up less space and likely have a lower insertion loss. The invention provides for a bandpass filter that is made tunable using a resonator that includes a FE tunable capacitor. The tunable bandpass filter can be used to make a tunable duplex.

Thus, a low insertion loss tunable bandpass and duplexer are provided, which are smaller and have less insertion loss than a fixed tuned bandpass filter covering the same passband. The space savings in a wireless handset can be used to provide other desired functions and properties, or their use can simply reduce the size, weight, or cost of the handset. Additionally, the savings in insertion loss result in a longer talk time and battery life.

More specifically, a tunable bandpass filter is provided that comprises a first shunt-connected ferroelectric (FE) tunable tank circuit having a first node to accept an input signal. A second shunt-connected FE tunable tank circuit has a second node to supply a bandpass filtered signal. A first capacitor is connected in series between the first and second nodes.

In one aspect, the first tank circuit comprises a first resonator having an input connected to the first node and an output. A fourth capacitor has an input connected to the first resonator output, and has an output connected to a reference voltage. The fourth capacitor is a tunable FE capacitor. Typically, a fifth capacitor has an input connected to the first node and an output connected to the reference voltage.

Likewise, the second tank circuit comprises a second resonator having an input connected to the second node and an output. A sixth (FE) capacitor has an input connected to the second resonator output, and has an output connected to the reference voltage. A seventh capacitor has an input connected to the second node and an output connected to the reference voltage.

Additional details of the above-described bandpass filter and a tunable duplexer are provided below.

DETAILED DESCRIPTION

Figure 1:
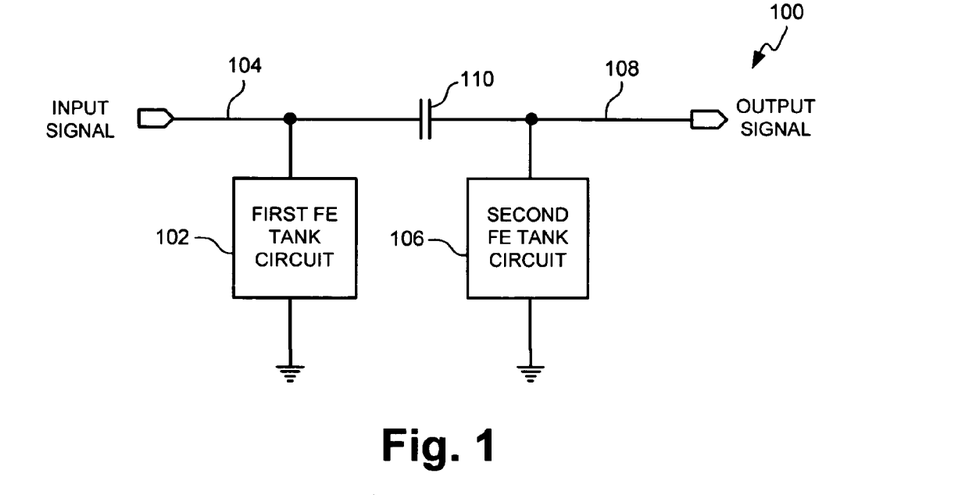
FIG. 1 is a schematic diagram of a tunable bandpass filter.

FIG. 1 is a schematic diagram of a tunable bandpass filter. The filter 100 comprises a first shunt-connected ferroelectric (FE) tunable tank circuit 102 having a first node 104 to accept an input signal. A second shunt-connected FE tunable tank circuit 106 has a second node 108 to supply a bandpass filtered signal. A first capacitor 110 is connected in series between the first node 104 and the second node 108.

Figure 2:
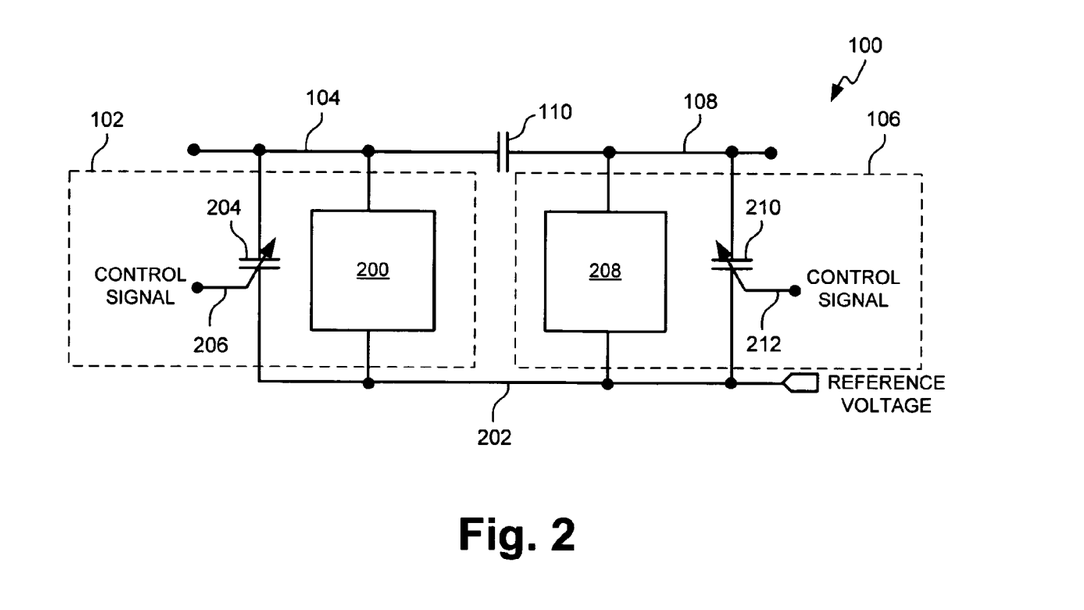
FIG. 2 is a schematic diagram illustrating a first variation of the bandpass filter of FIG. 1.

FIG. 2 is a schematic diagram illustrating a first variation of the bandpass filter of FIG. 1. In this variation the first tank circuit 102 comprises a first resonator 200 having an input connected to the first node 104 and an output connected to a reference voltage 202. For example, the reference voltage can be an AC or DC ground. A second capacitor 204 has an input connected to the first node 104, an output connected to the reference voltage 202, and an input to accept a control signal on line 206. The second capacitor 206 includes an FE material with a dielectric constant responsive to the control voltage on line 206. Although the control voltage is shown being introduced via a separate line, in some aspects the control voltage is introduced to the FE capacitors through one of the capacitor terminals. For example, the control voltage used to control second capacitor 206 may be introduced at node 104.

The second tank circuit 106 comprises a second resonator 208 having an input connected to the second node 108 and an output connected to the reference voltage 202. A third capacitor 210 has an input connected to the second node 108, an output connected to the reference voltage 202, and an input to accept a control signal on line 212. Again, the third capacitor 210 includes an FE material with a dielectric constant responsive to the control voltage on line 212.

Figure 3:
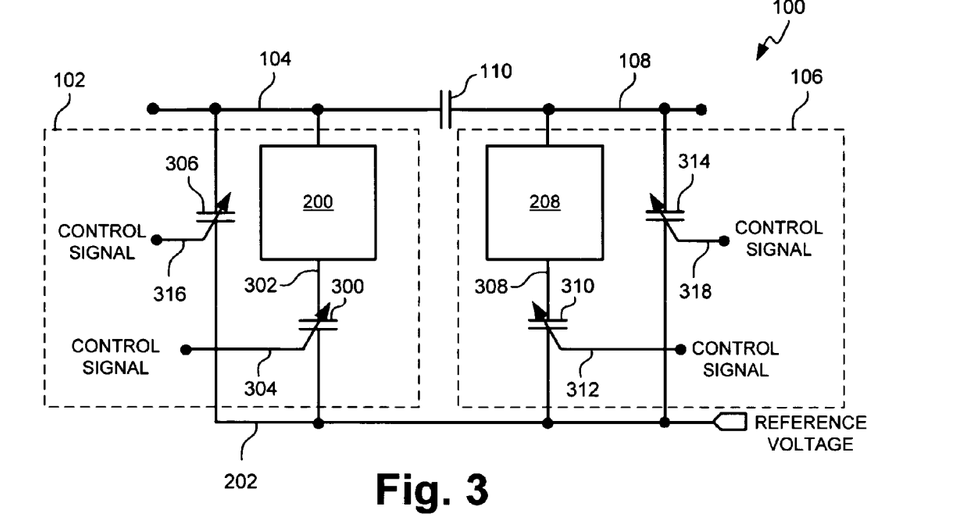
FIG. 3 is a schematic diagram illustrating a second variation of the bandpass filter of FIG. 1.

FIG. 3 is a schematic diagram illustrating a second variation of the bandpass filter of FIG. 1. The first tank circuit 102 comprises a first resonator 200 having an input connected to the first node 104 and an output on line 302. A fourth capacitor 300 has an input connected to the first resonator output on line 302, an output connected to a reference voltage 202, and an input to accept a control signal on line 304. The fourth capacitor 300 includes an FE material with a dielectric constant responsive to the control voltage on line 304. A fifth capacitor 306 has an input connected to the first node 104 and an output connected to the reference voltage 202.

The second tank circuit 106 comprises a second resonator 208 having an-input connected to the second node 108 and an output on line 308. A sixth capacitor 310 has an input connected to the second resonator output on line 308, an output connected to a reference voltage 202, and an input to accept a control signal on line 312. The sixth capacitor 310 includes an FE material with a dielectric constant responsive to the control voltage on line 312. A seventh capacitor 314 has an input connected to the second node 108 and an output connected to the reference voltage 202.

In one aspect (as shown), the fifth capacitor 306 is an FE tunable capacitor having an input to accept a control signal on line 316. The fifth capacitor 306 includes an FE material with a dielectric constant responsive to the control voltage on line 316. Likewise, the seventh capacitor 314 is an FE tunable capacitor having an input to accept a control signal on line 318. The seventh capacitor 314 includes an FE material with a dielectric constant responsive to the control voltage on line 318.

Figure 4:
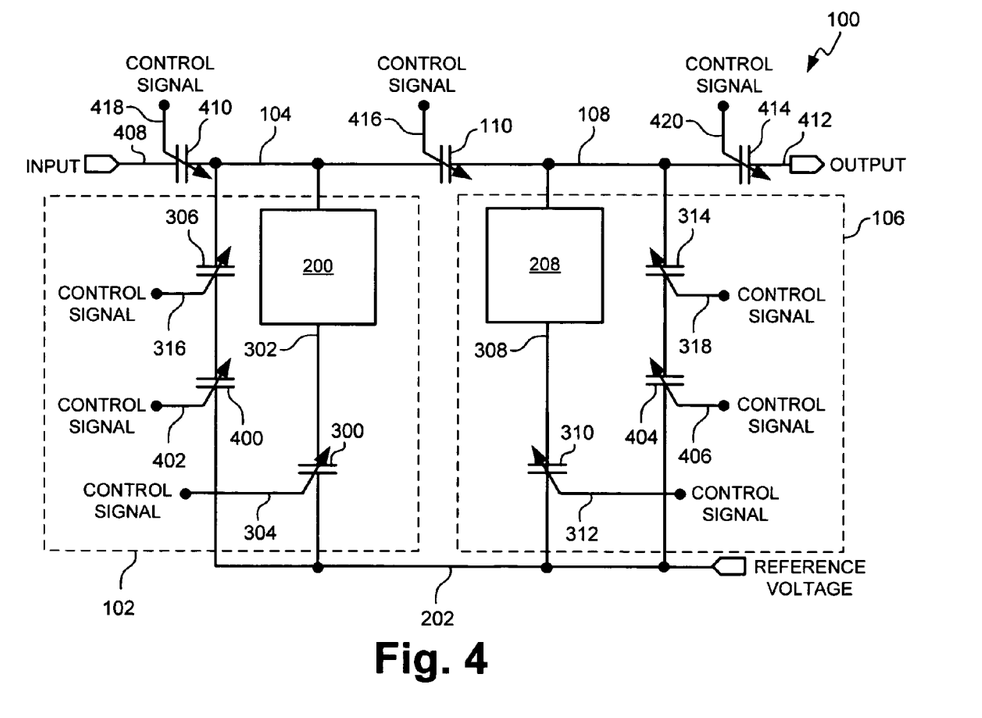
FIG. 4 is a schematic diagram illustrating a third variation of the bandpass filter of FIG. 1.

FIG. 4 is a schematic diagram illustrating a third variation of the bandpass filter of FIG. 1. This variation is the same as the bandpass filter of FIG. 3, with additional components. Here, the first tank circuit 102 further comprises an eighth capacitor 400 having an input and output interposed between the output of the fifth capacitor 306 and the reference voltage 202. The eighth capacitor 400 has an input on line 402 to accept a control signal. The eighth capacitor 400 includes an FE material with a dielectric constant responsive to the control voltage on line 402. The second tank circuit 106 further comprises a ninth capacitor 404 having an input and output interposed between the output of the seventh capacitor 314 and the reference voltage 202, and an input to accept a control signal on line 406. The ninth capacitor 404 includes an FE material with a dielectric constant responsive to the control voltage on line 406.

Although the following components are described in context of the circuit of FIG. 4, it should be understood that they could also be used with the circuits of FIGS. 1, 2, and 3. One skilled in the art having the benefit of this disclosure would understand their applicability, and an explicit discussion of modifications to FIGS. 1, 2, and 3 is bypassed in the interest of brevity. The filter 100 further comprises an input node 408 to accept the input signal. A tenth capacitor 410 has an input connected to the input node 408 and an output connected to the first node 104. An output node 412 supplies the filtered signal. An eleventh capacitor 414 has an input connected to the second node 108 and an output connected to the output node 412.

In one aspect, the first capacitor 110 is a FE tunable capacitor having an input an input on line 416 to accept a control signal. The first capacitor 110 includes-an FE material with a dielectric constant responsive to the control voltage on line 416. The tenth capacitor 410 may also be an FE tunable capacitor having an input on line 418 to accept a control signal. Likewise, the eleventh capacitor 414 may be a FE tunable capacitor having an input to accept a control signal on line 420.

A few examples are given to illustrate the enablement of the above-described passband filter. In one aspect the first capacitor 110, the tenth capacitor 410, and the eleventh capacitor 414 each have a capacitance in the range of 0.5 and 0.7 picofarads (pF). The fourth capacitor 300 and the sixth capacitor 310 each have a capacitance in the range of 2 and 4.1 pF. The fifth capacitor 306 and the seventh capacitor 314 each have a capacitance in the range of 0.5 and 1 pF. The first resonator 200 and second resonator 208 each have an inductance of about 2.6 nanoHenrys (nH). The first resonator 200 and the second resonator 208 may be coaxial, stripline, microstrip, or monoblock resonators. However, the filter is not limited to any particular resonator type.

In this example, it is assumed that the eighth capacitor 400 and ninth capacitor 404 have been removed, or have a very low impedance, so that the fifth capacitor 306 and seventh capacitor 314 are connected directly to the reference voltage 202. Alternately, the values given below for the fifth capacitor 306 may be considered to be the total capacitance value representing the combination of the fifth capacitor 306, series connected to the eighth capacitor 400. Likewise, the values given below for the seventh capacitor 314 may be considered to be the total capacitance value representing the combination of the seventh capacitor 314, series connected to the ninth capacitor 404.

As understood by one skilled in the art having the benefit of this disclosure, the above-mentioned FE capacitors may represent series-connected combinations of FE capacitors, parallel-connected FE capacitors, FE capacitors series connected with fixed value capacitors, and FE capacitors parallel connected with fixed value capacitors. These combinations may be desired so that practical FE capacitor values can be transformed for use in desired capacitance ranges. The combinations may make the tuning of an FE either more, or less sensitive, depending on the application. Further, fixed value capacitors may be used to isolate an FE capacitor control voltage from DC grounds in the circuit, or from the control voltage of a neighboring FE capacitor.

The above-mentioned component values and circuit configuration permit the bandpass filter 100 to be both broadly tunable between two different frequency bands, as well as finely tunable within each frequency band. For example, the Korean PCS (KPCS) wireless telephone system operates at 1750–1780 megahertz (MHz) (Tx) to 1840–1870 MHz (Rx). The United States PCS (USPCS) system operates at 1850–1910 MHz (Tx) to 1930–1990 MHz (Rx). The exemplary filter 100 of FIG. 4 is able to tune between 1710 and 1910 MHz. Thus, it can be used to tune within both the KPCS and USPCS transmit bands. Therefore, the bandpass filter 100 could be the transmitter section of a duplexer. This tunable duplexer permits the same wireless telephone to operate in both Korea and the US. There are a number of frequency bands, associated with CDMA, GSM, and WCDMA telephone systems, operating in the frequencies between approximately 2.4 gigahertz and 500 MHz. One skilled in the art having the benefit of this disclosure would be able to tailor the bandpass filter design of FIG. 4 to operate anywhere within this range of frequencies.

In the US, the cellular band (AMPS), at around 850 megahertz (MHz), and the PCS (Personal Communication System) band, at around 1900 MHz, are used. Other communication bands include the PCN (Personal Communication Network) and DCS at approximately 1800 MHz, the GSM system (Global System for Mobile communication) at approximately 900 MHz, and the JDC (Japanese Digital Cellular) at approximately 800 and 1500 MHz. Other bands of interest are GPS signals at approximately 1575 MHz, Bluetooth at approximately 2400 MHz, and wideband code division multiple access (WCDMA) at 1850 to 2200 MHz.

Generally, the capacitors in series with the resonators (fourth capacitor 300 and sixth capacitor 310) provide the-coarse tuning. The fine tuning is provided by the capacitors in series with the resonators (fifth capacitor 306 and seventh capacitor 314), and by the coupling capacitors (first capacitor 110, tenth capacitor 410, and eleventh capacitor 414).

To continue the example, in one aspect the first capacitor 110 has a capacitance of 0.7 pF, the fourth and sixth capacitors 300/310 each have a capacitance of 3.45 pF, the fifth and seventh capacitors 306/314 each have a capacitance of 0.53 pF, and the tenth and eleventh capacitors 410/414 each have a capacitance of 0.65 pF. Then, the filter 100 is tuned to optimally pass signals from the input node 408 to the output node 412 having a frequency of about 1750 megahertz (MHz). That is, the filter has a minimum insertion loss at 1750 MHz.

In a second example, the first capacitor 110 has a capacitance of 0.5 pF, the fourth and sixth capacitors 300/310 each have a capacitance of 2 pF, the fifth and seventh capacitors 306/314 each have a capacitance of 1 pF, and the tenth and eleventh capacitors 410/414 each have a capacitance of 0.59 pF. Then, the filter 100 is tuned to optimally pass signals having a frequency of about 1850 MHz.

In a third example, the first capacitor 110 has a capacitance of 0.7 pF, the fourth and sixth capacitors 300/310 each have a capacitance of 1.72 pF, the fifth and seventh capacitors 306/314 each have a capacitance of 0.78 pF, and the tenth and eleventh capacitors 410/414 each have a capacitance of 0.59 pF. Then, the filter 100 is tuned to optimally pass signals having a frequency of about 1910 MHz.

In a fourth example, the first capacitor 110 has a capacitance of 0.67 pF, the fourth and sixth capacitors 300/310 each have a capacitance of 4.1 pF, the fifth and seventh capacitors 306/314 each have a capacitance of 1 pF, and the tenth and eleventh capacitors 410/414 each have a capacitance of 0.65 pF. Then, the filter 100 is tuned to optimally pass signals having a frequency of about 1700 MHz.

Details of the FE capacitors are provided below. Generally, the above-described FE capacitors have a quality factor greater than about 80 in the temperature range between −50 and 100 degrees C. The quality factor is related to the measures of loss and quality factor (Q). The FE capacitor types are typically an interdigital capacitor (IDC), overlay, or gap capacitor design.

Figure 5:
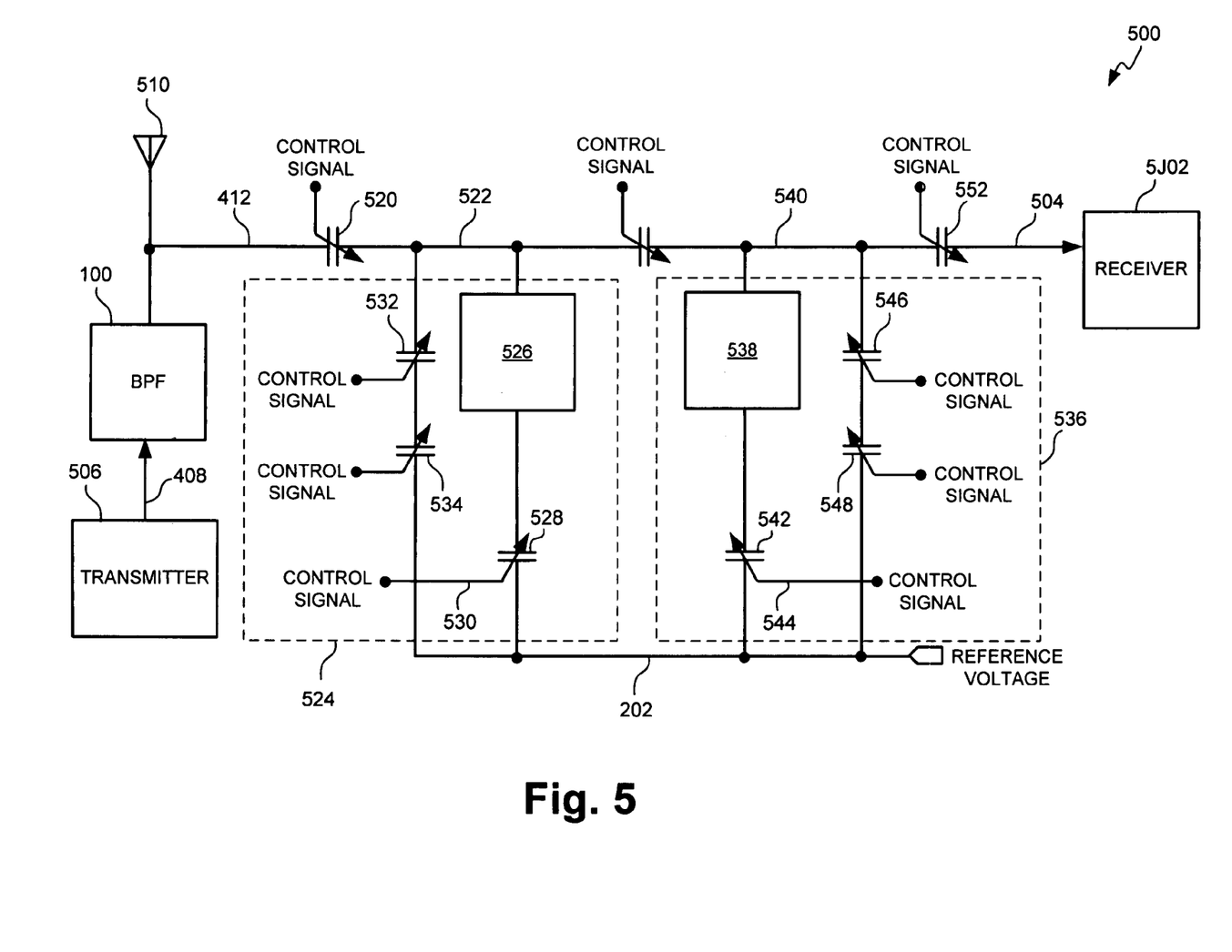
FIG. 5 is a schematic block diagram of a wireless telephone device with a tunable duplexer.

FIG. 5 is a schematic block diagram of a wireless telephone device with a tunable duplexer. The device 500 comprises a receiver 502 having an input on line 504, a transmitter 506 having an output on line 408, and an antenna 510 having an antenna port on line 412. A duplexer 514 comprises an input node connected to the antenna port on line 408, a first bandpass filter 100, and a second bandpass filter 516. The first bandpass filter may be the same as the filters shown in FIGS. 1 through 4. Therefore, details of the filter 100 are not shown in FIG. 5. In the interest of brevity, the description of filter 100 is not repeated here.

The design of the second bandpass filter 516 is essentially the same as the first bandpass filter 100. Note, the actual component values the first bandpass filter 100 may vary from the second bandpass filter 516, as they typically do not tune exactly the same frequency bands. However, in one aspect the two filters are identical and designed to tune within multiple Rx and Tx bands. Such as design simplifies manufacturing by permitting identical bandpass filter assemblies to be used for both the Rx and Tx sections of the duplexer 500.

The second bandpass filter 516 comprises a twelfth capacitor 520 connected between the input node 412 and a third node 522. A third tank circuit 524 comprises a third resonator 526 having an input connected to the third node 522 and an output. A thirteenth capacitor 528 has an input connected to the third resonator output, an output connected to a reference voltage 202, and an input to accept a control signal on line 530. The thirteenth capacitor 528 includes an FE material with a dielectric constant responsive to the control voltage on line 530. A fourteenth capacitor 532 has an input connected to the third node 522 and an output connected to the reference voltage. As in filter 100, a nineteenth capacitor 534 can be inserted in series between the fourteenth capacitor 532 and the reference voltage 202, for greater tunability. In one aspect, the fourteenth and nineteenth capacitors 532/534 can be FE capacitors responsive to control signals.

A fourth tank circuit 536 comprises a fourth resonator 538 having an input connected to a fourth node 540 and an output. A fifteenth capacitor 542 has an input connected to the fourth resonator output, an output connected to a reference voltage 202, and an input to accept a control signal on line 544. The fifteenth capacitor 542 includes an FE material with a dielectric constant responsive to the control voltage on line 544. A sixteenth capacitor 546 has an input connected to the fourth node 540 and an output connected to the reference voltage 202. A twentieth capacitor 548 can be series-connected between the sixteenth capacitor 546 and the reference voltage 202, for greater tunability. In one aspect, the sixteenth and twentieth capacitors 546/548 can be FE capacitors responsive to control signals.

A seventeenth capacitor 550 connects the third node 522 to the fourth node 540. An eighteenth capacitor 552 connects the fourth node 540 and the receiver on line 412. In one aspect, the eighteenth capacitor 552, the seventeenth capacitor 550, and the twelfth capacitor 520 are FE capacitors having a dielectric constant, and therefore a capacitance value, responsive to a control signal.

Figure 6:
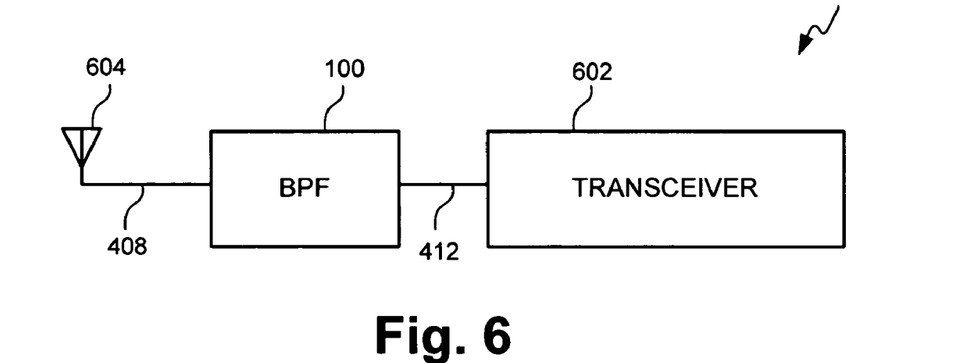
FIG. 6.is a schematic block diagram of a wireless telephone device with a tunable filter.

FIG. 6 is a schematic block diagram of a wireless telephone device with a tunable filter. The device 600 comprises a transceiver 602 having an interface port on line 412, an antenna 604 having an antenna port on line 408, and a tunable bandpass filter 100. The bandpass filter 100 can be one of the filters described in FIGS. 1, 2, 3, or 4. Therefore, details of the filter are omitted in the interest of brevity. The transceiver 602 may represent a receiver, transmitter, or both. In some aspects, the filter 100 is part of a duplexer (not shown).

Functional Description

In designing a tunable bandpass filter, out-of-band rejection, passband insertion loss, size, weight and other mechanical, environmental and electrical requirements should be considered. Typically, the passband is defined by the points where the bandpass filter response falls to 3.0 dB below the mid-band, or band-center insertion loss. Higher order (more resonators) bandpass filters improve the out-of-band rejection, at the cost of greater insertion loss.

Tunable BPFs have the best chance of replacing fixed-tuned BPFs in those cases where the fixed-tuned BPF covers a system bandwidth that is greater than that required for the transmission or reception of a single channel. For example, a fixed-tuned BPF in a handset for operation in the US CDMA PCS band covers such a BW. It will be understood that this is also true of US cellular CDMA and many other standards. The techniques, methods and devices taught herein are applicable to many standards besides US CDMA PCS. US CDMA PCS is discussed as an example only.

As mentioned earlier, in the U.S. PCS band, 60 MHz is allocated for Tx (1850 to 1910 MHz) and 60 MHz for Rx (1930 to 1990 MHz). The CDMA standard is a full duplex system, meaning the handset is capable of simultaneously transmitting and receiving. To accomplish this, a duplexer filter is needed to separate the bands and prevent interference. While the PCS band is 60 MHz wide, the individual CDMA channel is only 1.25 MHz wide. Current system architecture, however, forces CDMA PCS bandpass filters and multiplexers (including duplexers) to have a BW of greater than 60 MHz, to allow the system to accommodate operation of any 1.25 MHz channel in any region of the 60 MHz band.

A tunable PCS band filter alters this situation by meeting the worst case rejection specifications, while providing a lower order BPF of simpler topology that occupies a smaller physical area. Assuming high-Q components are used, such a lower order filter necessarily provides lower insertion loss, as is well understood in the art.

In the replacement of a high-order fixed-tuned BPF with a low-order tunable BPF, three factors are presented. First, the bandwidth (Q1) of the low-order BPF and the chosen topology must be such that the worst case rejection specification is met. Because Q1=f0/BW, as the 3 dB bandwidth (BW) decreases, the IL increases. Thus, if BW is too small relative to f0, the resulting BPF has an unacceptably high IL.

Second, the low-order tunable filter must be tunable to cover the entire BW, just as with a fixed-tuned filter. Finally, the tunable capacitor used within the low-order tunable filter should be of sufficiently low loss. The total loss of a capacitor, Lt, whether tunable or not, is given by a ratio of its dissipated to stored energy, where the energy is stored in the electric field and dissipated in resistance, i.e., Lt= (dissipated energy)/(stored energy). The inverse of this loss is the quality factor, Q. For a capacitor, Lt may be given by the quantity ($\omega*Rs*C$), where $\omega$ is the frequency in radians, Rs is the total series resistance of the capacitor, and C is the capacitance.

The importance of determining the total loss given by an FE capacitor in a resonant circuit can be seen from the following equations:

Lc=1/Qc and 1/Qt=1/Qc+1/Qu, where,

Lc=the loss of the capacitor;

Qt=the total Q of the FE capacitor and the resonator or inductor combined;

Qc=the Q of the capacitor; and

Qu=the Q of the unloaded resonator or alternatively, the Q of an inductor used to create a parallel resonant circuit.

As Qc increases, it will affect the Qt less. If Qc is infinite, it has no affect on Qt. For practical purposes, this is also true if Qc is approximately 10*Qu. The converse is true too. As Qu becomes higher relative to Qc, Qu has less effect on Qt. In either case, the highest practical Qc is desired.

For example in the PCS band, for a 1.0 pF tunable capacitor to have a Qc=250 at 2.0 GHz, Rs is about 0.32 Ω (ohms). To minimize loss (obtain a low Rs), requires an accounting of all loss mechanisms present and an elimination of these loss mechanisms if possible.

For FE devices, the total loss is governed by summing each source contribution as follows:

Lt=Lgeom+Lattach+Lmetal+Lsub+Lrad+Lmeas+LFE;

where Lgeom is derived from the topology of the capacitor,

Lattach is loss due to device attachment,

Lmetal is the total metal loss,

Lsub is the base substrate loss (if present),

Lrad is the radiation loss, both desired and undesired,

Lmeas is the total loss arising from measurement errors, and

LFE is the FE loss tangent. A more detailed treatment of this subject can be found in U.S. Pat. No. 6,639,491, which is incorporated herein by reference.

FE film properties and fabrication play a significant role in overall capacitor loss. Many techniques exist to mitigate and minimize FE film loss. One feature of FE films is that FE film loss and tunability usually have an inverse relationship. The greater the FE dielectric constant tuning range, the greater is the FE loss in most cases.

Thus, even though FE materials can achieve a dielectric constant tuning range of about 3 to 1, less tuning may be acceptable for a given filter application. In that case, less tuning would be chosen, with the benefit of less loss. For example, in the US PCS CDMA band, the tuning requirement in the transmit band is from 1850 MHz to 1910 MHz, or about 4%. Even if the KPCS and USPCS is combined (1750 to 1910 MHz, or about 8%), the FE material can have significantly less tunability than 3 to 1.

For example, an FE gap capacitor with 0.6 pF at 0V DC bias, needs to tune 33%, (from 0.6 pF down to 0.4 pF) to tune over the PCS transmit band. The actual tuning range depends on the BPF topology and the band over which the BPF is tuned. The required tuning voltage to provide the 33% tuning in this example depends on the FE capacitor geometry, including FE film thickness, and the FE film characteristics. The effect of dielectric constant tunability on frequency tunability is determined by the filter topology.

With respect to Lgeom for a gap capacitor, the major contributions to loss are the four corners formed by the gap. These losses can be reduced by rounding the corners. In comparison to gap and interdigital capacitors, an overlay capacitor has the lowest Lgeom. An overlay capacitor is an example of a parallel plate geometry where the plate dimensions (length and width) are much greater than the plate separation. Given such a geometry, most of the electric field between the plates is uniform except for fringing along the edges. The fringing effect can be reduced significantly by the use of a guard band. Thus, the geometric loss from a parallel plate capacitor is quite low. In addition, parallel plate geometries can provide high capacitances along with high tuning from small control voltage swings.

Figure 7:
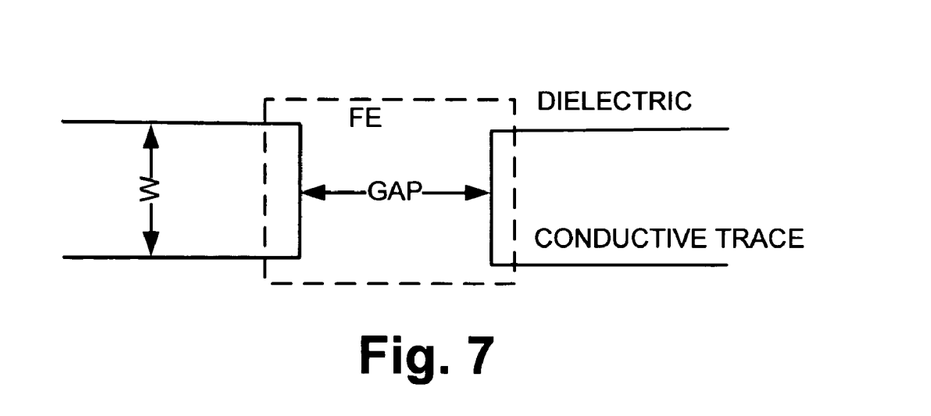
FIG. 7 is a plan view of a distributed element gap capacitor.

FIG. 7 is a plan view of a distributed element gap capacitor. Compared to an IDC, the gap capacitor has a better Q, but lower capacitance per unit cross section (W). The IDC's capacitance is greater due to the use of a number of fingers per unit cross section. For many communication filter applications, however, large capacitance (C≧4.0 pF) is not needed. Thus, a gap capacitor often can provide adequate capacitance. The inherently high value of κ for most FE films helps provide relatively high capacitance per unit cross-section, W, compared to a conventional gap capacitor.

Figure 8:
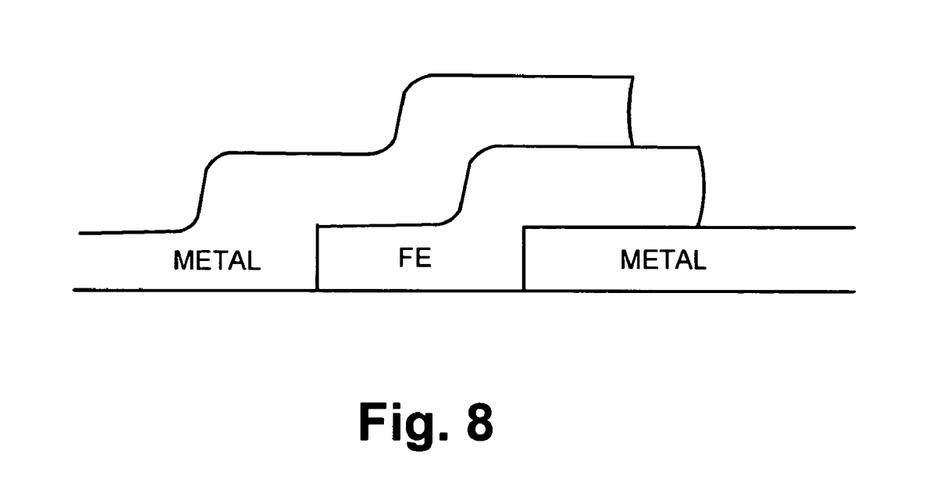
FIG. 8 is a cross-sectional view of an overlay capacitor.

FIG. 8 is a cross-sectional view of an overlay capacitor. In comparison to gap and interdigital capacitors, an overlay capacitor has the lowest Lgeom. An overlay capacitor is an example of a parallel plate geometry where the plate dimensions (length and width) are much greater than the plate separation. Given such a geometry, most of the electric field between the plates is uniform except for fringing along the edges. The fringing effect can be reduced significantly by the use of a guard band. Thus, the geometric loss from a parallel plate capacitor is quite low. In addition, parallel plate geometries can provide high capacitances along with high tuning from small control voltage swings.

Figure 9:
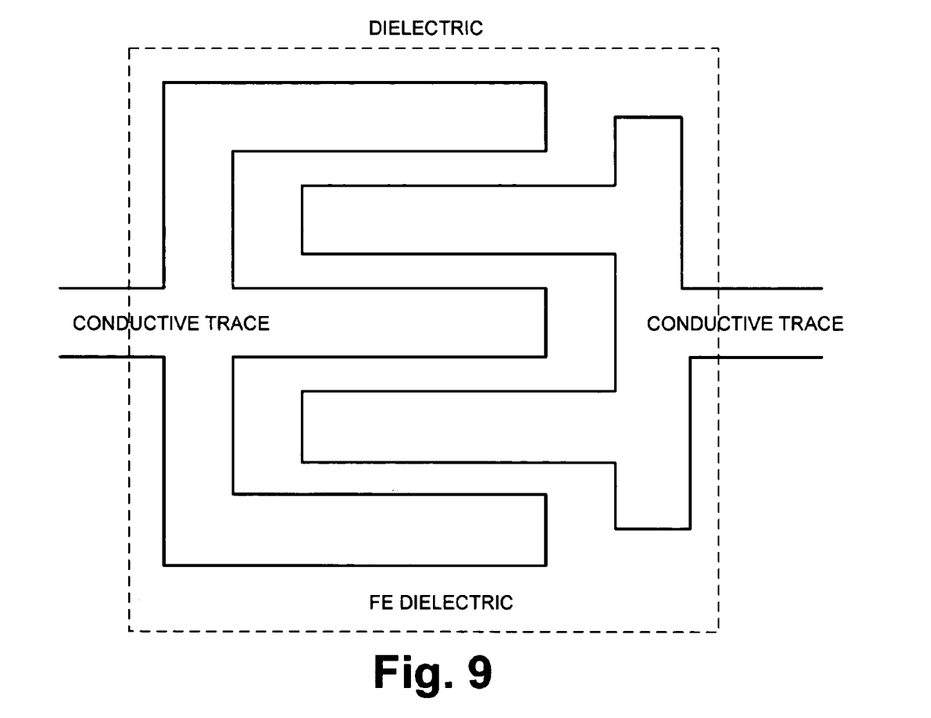
FIG. 9 is a plan view of an interdigital (IDC) capacitor.

FIG. 9 is a plan view of an interdigital (IDC) capacitor. For a given cross-sectional area, an IDC can provide a higher capacitance than a gap capacitor. Loss increases as the gap spacing decreases. Similarly, loss increases as finger width decreases. The finger length also affects loss, with loss increasing as finger length increases; especially in a microstrip realization of an IDC, as the odd mode loss dominates in such a structure. In addition, loss increases as the number of fingers increases, due to loss introduced from the additional sharp corners. Note that an increase in the number of fingers typically increases the capacitance of an IDC.

In general, a gap capacitor is easiest to fabricate. An IDC is next easiest, and an overlay capacitor is hardest of these three. Compared to an IDC, the gap capacitor has a better Q, but lower capacitance per unit cross-section. The IDC's capacitance is greater due to the use of a number of fingers per unit cross section. For many communication filter applications, however, large capacitance (C greater than 4.0 pF) is not needed. Thus, a gap capacitor often can provide adequate capacitance. The inherently high value of dielectric constant for most FE films helps provide relatively high capacitance per unit cross section, compared to a conventional gap capacitor.

The highest possible Qu for a resonator should be used to minimize IL, given size and height constraints. To define Qu, a stage can defined, which is formed by a resonator series connected to a capacitor. The resonator may be grounded quarter wavelength resonator, but the length of the resonator can be selected to obtain a particular inductance value. Volumetric resonators (e.g., coaxial, stripline, and monoblock) are often preferred, as they provide the highest Qu and smallest area and height at a minimal price, as compared to planar, i.e., microstrip, alternatives. For high volume applications, such as wireless handsets, transverse electromagnetic (TEM) wave volumetric resonators may be preferred. Such volumetric resonators can be ceramic loaded coaxial resonators, slabline (monoblock) or stripline, to name the three most common realizations.

Figure 10:
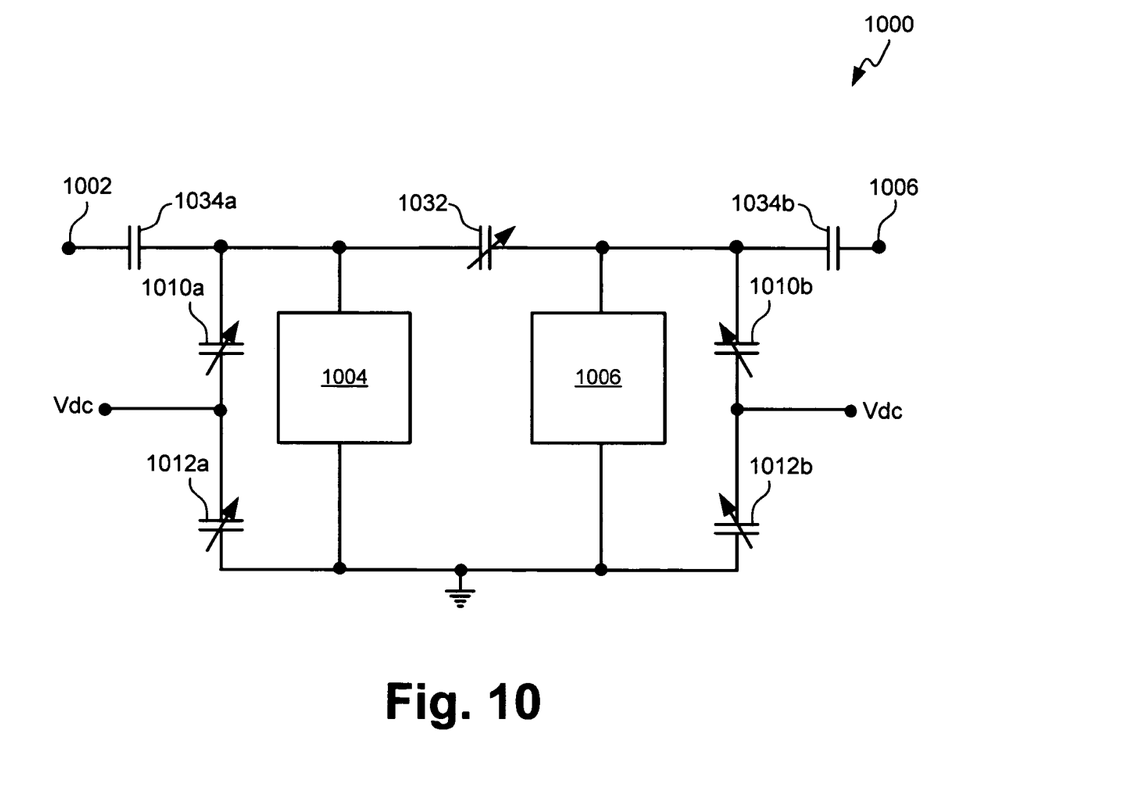
FIG. 10 is a schematic diagram depicting a variation of the bandpass filter of FIG. 2.

FIG. 10 is a schematic diagram depicting a variation of the bandpass filter of FIG. 2. A two-stage top capacitively coupled (TCC) tunable BPF 1000 is illustrated. Each stage of bandpass filter 1000 comprises a resonator 1004 and 1008 and FE capacitor 1010a and 1010b. The resonators 1004 and 1008 are shown as ¼ wavelength short-circuited resonators but may also be ½ wavelength open circuit resonators.

A variable DC voltage, or control signal is applied to the FE capacitors 1010a and 1010b, to tune the bandpass filter 1000. This is an example of where the control signal is introduced to the capacitor terminal. The FE capacitors 1010a and 1010b couple to ground through DC blocking capacitors 1012a and 1012b, since the resonators are shorted in this example.

An RF signal is received at input port 1002 and output at output port 1006. Note that input port 1002 and output port 1006 are interchangeable. In addition to input capacitor 1034a and output capacitor 1034b, an additional capacitor 1032 is provided as an impedance and admittance inverter between the resonators 1004 and 1008 to create the desired BPF response. It will be appreciated that capacitor 1032 can also be a discrete element or implemented through aperture coupling between resonators 1004 and 1008.

Figure 11:
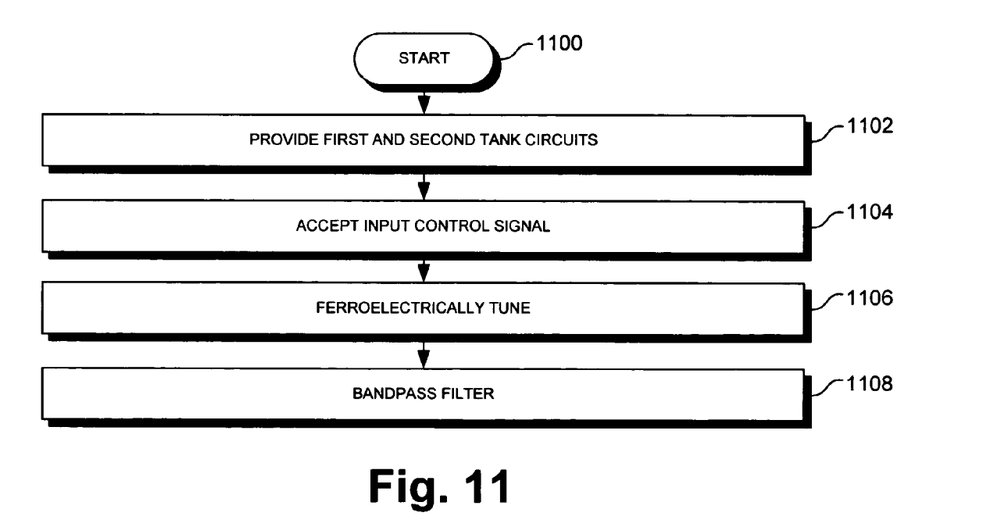
FIG. 11 is a flowchart illustrating a method for bandpass filtering a signal.

FIG. 11 is a flowchart illustrating a method for bandpass filtering a signal. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1100.

Step 1102 provides a first tank circuit, with a resonator and parallel capacitor, capacitively coupled to a second tank circuit with a resonator and parallel capacitor. Step 1104 accepts an input signal. Step 1106 ferroelectrically tunes the resonators of the first and second tank circuits. Step 1108 bandpass filters the input signal in response to ferroelectrically tuning the resonators.

In one aspect, providing first and second tank circuits in Step 1102 comprises providing a ferroelectric (FE) capacitor series connected with each resonator, where each FE capacitor is made with a ferroelectric material having a dielectric constant responsive to a control signal. Then, ferroelectrically tuning the resonators of the first and second tank circuits in Step 1106 comprises supplying control signals to the FE capacitors connected in series to the resonators.

In another aspect, providing first and second tank circuits in Step 1102 comprises providing a FE capacitor in parallel with each resonator, where each FE capacitor is made with a ferroelectric material having a dielectric constant responsive to a control signal. Then, ferroelectrically tuning the resonators of the first and second tank circuits in Step 1106 comprises supplying control signals to the FE capacitors connected in parallel with the resonators.

In one aspect, Step 1102 provides a FE capacitor in parallel with each resonator and in series with each resonator, where each FE capacitor is made with a ferroelectric material having a dielectric constant responsive to a control signal. Then, Step 1106 supplies control signals to the FE capacitors connected in parallel and in series with the resonators.

A tunable bandpass filter has been provided. Specific filter topologies have been provided to illustrate the invention. Further, a duplexer application and particular frequency bands have been provided as examples. However, the invention is not limited to merely these illustrations and examples. Other variations and embodiments of the invention will occur to those skilled in the art having the benefit of this disclosure.

What is claimed is:

1. A tunable bandpass filter comprising:
   a first ferroelectric (FE) tank circuit comprising:
      a first node to accept an input signal;
      a first resonator having a first resonator input connected to the first node and a first resonator output connected to a reference voltage; and
      a second capacitor having a second capacitor input connected to the first node, a second capacitor output connected to the reference voltage, and a control signal input to accept a control signal, the second capacitor comprising an FE material with a dielectric constant responsive to the control signal;
   a second FE tank circuit comprising:
      a second node to supply a bandpass filtered signal;
      a second resonator having a second resonator input connected to the second node and a second resonator output connected to the reference voltage; and
      a third capacitor having a third capacitor input connected to the second node, a third capacitor output connected to the reference voltage, and a second control signal input to accept a second control signal, the third capacitor comprising a second FE material with a second dielectric constant responsive to the second control signal; and
   a first capacitor connected in series between the first node and the second node.

2. A tunable bandpass filter comprising:
   a first ferrorelectric (FE) tunable tank circuit comprising:

a first node to accept an input signal;
a first resonator having a first resonator input connected to the first node and a first resonator output;
a first capacitor having a first capacitor input connected to the first resonator output, a first capacitor output connected to a reference voltage, and a first control input to accept a first control signal, the first resonator capacitor comprising a first FE material with a first dielectric constant responsive to the first control signal; and
a second capacitor having a second capacitor input connected to the first node and a second capacitor output connected to the reference voltage;
a second ferroelectric (FE) tunable tank circuit comprising:
a second node to supply a band pass filtered signal;
a second resonator having a second resonator input connected to the second node and a second resonator output;
a third capacitor having a third capacitor input connected to the second resonator output, a third capacitor output connected to the reference voltage, and a third control input to accept a third control signal, the third capacitor comprising a third FE material with a third dielectric constant responsive to the third control signal; and
a fourth capacitor having a fourth capacitor input connected to the second node and a fourth capacitor output connected to the reference voltage; and
a fifth capacitor connected in series between the first node and the second node.

3. The tunable bandpass filter of claim 2 wherein the second capacitor comprises:
a second control input to accept a second control signal, and
a second FE material with a second dielectric constant responsive to the second control signal; and
wherein the fourth capacitor comprises:
a fourth control input to accept a fourth control signal, and
a fourth FE material with a fourth dielectric constant responsive to the fourth control signal.

4. The tunable bandpass filter of claim 3 wherein the first FE tunable tank circuit further comprises:
a sixth capacitor having a sixth capacitor input and output interposed between the second capacitor output and the reference voltage, and a sixth capacitor input to accept a sixth control signal, the sixth capacitor comprising a sixth FE material with a sixth dielectric constant responsive to the sixth control signal; and
wherein the second FE tunable tank circuit further comprises:
a seventh capacitor having a seventh capacitor input and output interposed between the fourth capacitor output and the reference voltage, and an a seventh capacitor input to accept a seventh control signal, the seventh capacitor comprising a seventh FE material with a seventh dielectric constant responsive to the seventh control signal.

5. The tunable bandpass filter of claim 2 further comprising:
an input node to accept the input signal;
an eighth capacitor having an eighth capacitor input connected to the input node and an eighth capacitor output connected to the first node;
an output node to supply the filtered signal; and a ninth capacitor having ninth capacitor input connected to the second node and a ninth capacitor output connected to the output node.

6. The tunable bandpass filter of claim 5 wherein the fifth capacitor has a fifth input to accept a fifth control signal, the fifth capacitor a fifth FE material with a fifth dielectric constant responsive to the fifth control voltage;
wherein the eighth capacitor has an eighth input to accept an eighth control signal, the eighth capacitor comprising an eighth FE material with an eighth dielectric constant responsive to the eighth control signal; and
wherein the ninth capacitor has a ninth input to accept a ninth control signal, the ninth capacitor including ninth FE material with a ninth dielectric constant responsive to the ninth control signal.

7. The tunable bandpass filter of claim 6 wherein the fifth, eighth and tenth capacitors each have a capacitance in the range of 0.5 and 0.7 picofarads (pF);
wherein the first and third capacitors each have a capacitance in the range of 2 and 4.1 pF;
wherein the second and fourth capacitors each have a capacitance in the range of 0.5 and 1 pF;
wherein the first and second resonators each have an inductance of about 2.6 nanoHenrys (nH);
wherein the first tank circuit further comprises a sixth capacitor having an input and output interposed between the second capacitor output and the reference voltage, the sixth capacitor having a capacitance of about 200 pF; and
wherein the second tank circuit further comprises a seventh capacitor having an input and output interposed between the fourth capacitor output and the reference voltage, the fourth capacitor having a capacitance of about 200 pF.

8. The tunable bandpass filter of claim 7 wherein the fifth capacitor has a capacitance of 0.7 pF;
wherein the first and third capacitors each have a capacitance of 3.45 pF;
wherein the second and fourth capacitors each have a capacitance of 0.53 pF;
wherein the eighth and ninth capacitors each have a capacitance of 0.65 pF; and
wherein the runable bandpass filter is tuned to optimally pass signals from the input node to the output node having a frequency of about 1750 megahertz (MHz).

9. The tunable bandpass filter of claim 7 wherein the fifth capacitor has a capacitance of 0.5 pF;
wherein the first and third capacitors each have a capacitance of 2 pF;
wherein the second and fourth capacitors each have a capacitance of 1 pF;
wherein the eighth and ninth capacitors each have a capacitance of 0.59 pF; and
wherein the tunable bandpass filter is tuned to optimally pass signals from the input node to the output node having a frequency of about 1850 MHz.

10. The tunable bandpass filter of claim 7 wherein the fifth capacitor has a capacitance of 0.7 pF;
wherein the first and third capacitors each have a capacitance of 1.72 pF;
wherein the second and fourth capacitors each have a capacitance of 0.78 pF;
wherein the eighth and ninth capacitors each have a capacitance of 0.59 pF; and
wherein the tunable bandpass filter is tuned to optimally pass signals from the input node to the output node having a frequency of about 1910 MHz.

11. The tunable bandpass filter of claim 7 wherein the fifth capacitor has a capacitance of 0.67 pF;
   wherein the first and third capacitors each have a capacitance of 4.1 pF;
   wherein the second and fourth capacitors each have a capacitance of 1 pE;
   wherein the eighth and ninth capacitors each have a capacitance of 0.65 pF; and
   wherein the tunable bandpass filter is tuned to optimally pass signals from the input node to the output node having a frequency of about 1700 MHz.

12. The tunable bandpass filter of claim 2 wherein the first capacitor and the third capacitor each have a quality factor greater than about 80 in the temperature range between −50 and 100 degrees C.

13. The tunable bandpass filter of claim 2 wherein the first and second resonators are resonator types selected from the group including coaxial, stripline, microstrip, and monoblock resonators.

14. The tunable bandpass filter of claim 2 wherein the first capacitor and the third capacitor are FE capacitor types selected from the group including interdigital capacitor (IDC), overlay, and gap capacitors.

15. A method for bandpass filtering a signal, the method comprising:
   accepting an input signal on a first node, the first node electrically connected to a first tank circuit and a second tank circuit, the first tank circuit comprising a first resonator connected in series to a first ferroelectric (FE) capacitor and in parallel to a third capacitor, the second tank circuit comprising a second resonator connected in series to a second FE capacitor and in parallel to a fourth capacitor;
   tuning the first resonator of the first tank circuit comprising: supplying a first control signal to the first FE capacitor to change a first dielectric constant of a first FE material of the first FE capacitor;
   tuning a second resonator of the second tank circuit comprising: supplying a second control signal to the second FE capacitor to change a second dielectric constant of a second FE material of the second FE capacitor;
   in response to tuning the first resonator and the second resonator, bandpass filtering the input signal.

16. The method of claim 15 wherein the third capacitor is a third FE capacitor comprising a third a ferroelectric material having a third dielectric constant responsive to a third control signal;
   wherein the fourth capacitor is a fourth FE capacitor comprising a fourth ferroelectric material having a fourth dielectric constant responsive to a fourth control signal; and
   wherein tuning the first and second resonators of the first and second tank circuits further comprises supplying control signals to the third and fourth FE capacitors.

17. The method of claim 16 wherein a fifth capacitor is connected between the first node and the second tank circuit.

18. A wireless telephone device with a tunable duplexer, the device comprising:
   a receiver having an input;
   a transmitter having an output;
   an antenna having an antenna port;
   a duplexer comprising a first port connected to the antenna port, a second port connected to the transmitter output, and a third port;
   a tunable bandpass filter coupled between the duplexer third port and the receiver input, the tunable bandpass filter comprising:
      a first shunt-connected ferroelectric (FE) tunable tank circuit having a first node to accept an input signal, comprising:
         a first resonator connected between the first node an a reference voltage; and
         a second FE capacitor connected in parallel to the first resonator, the second FE capacitor comprising an FE material with a dielectric constant responsive to a control signal applied to the FE material;
      a second shunt-connected FE tunable tank circuit having a second node to supply a bandpass filtered signal, comprising:
         a second resonator connected between the second node an the reference voltage; and
         a third FE capacitor connected in parallel to the second resonator, the third FE capacitor comprising a third FE material with a third dielectric constant responsive to a third control signal applied to the third FE material; and
      a first capacitor connected in series between the first and second nodes.

* * * * *